(12) United States Patent
Tian et al.

(10) Patent No.: US 10,636,987 B2
(45) Date of Patent: Apr. 28, 2020

(54) FLEXIBLE DISPLAY SUBSTRATE, METHOD FOR MANUFACTURING THE SAME, FLEXIBLE DISPLAY PANEL, AND FLEXIBLE DISPLAY DEVICE

(71) Applicant: BOE Technology Group Co., Ltd., Beijing (CN)

(72) Inventors: Hongwei Tian, Beijing (CN); Yanan Niu, Beijing (CN); Meng Zhao, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/033,143

(22) Filed: Jul. 11, 2018

(65) Prior Publication Data

US 2019/0165287 A1 May 30, 2019

(30) Foreign Application Priority Data

Nov. 30, 2017 (CN) .......................... 2017 1 1246122

(51) Int. Cl.
| | |
|---|---|
| *H01L 51/00* | (2006.01) |
| *H01L 51/52* | (2006.01) |
| *H01L 51/56* | (2006.01) |
| *H01L 29/423* | (2006.01) |
| *H01L 29/417* | (2006.01) |

(Continued)

(52) U.S. Cl.
CPC ...... *H01L 51/0097* (2013.01); *H01L 27/3262* (2013.01); *H01L 29/0847* (2013.01); *H01L 29/41733* (2013.01); *H01L 29/42384* (2013.01); *H01L 51/5206* (2013.01); *H01L 51/5221* (2013.01); *H01L 51/56* (2013.01); *H01L 2251/5338* (2013.01)

(58) Field of Classification Search
CPC ......... H01L 2251/5338; H01L 51/0097; H01L 27/3262
See application file for complete search history.

(56) References Cited

U.S. PATENT DOCUMENTS

| | | | |
|---|---|---|---|
| 9,887,386 B2 | 2/2018 | Park et al. | |
| 10,249,652 B2* | 4/2019 | Li | ........................ H01L 27/1288 |
| 2016/0226024 A1* | 8/2016 | Park | .................... H01L 51/5256 |

FOREIGN PATENT DOCUMENTS

| | | |
|---|---|---|
| CN | 104752365 A | 7/2015 |
| CN | 105845707 A | 8/2016 |
| EP | 2784575 A1 | 10/2014 |

OTHER PUBLICATIONS

Office Action issued in corresponding Chinese Patent Application No. 201711246122.9, dated Nov. 28, 2019.

* cited by examiner

*Primary Examiner* — Stephen M Bradley
(74) *Attorney, Agent, or Firm* — McDermott Will & Emery LLP

(57) ABSTRACT

A flexible display substrate, a method for manufacturing the same, a flexible display panel, and a flexible display device. The flexible display substrate includes: a flexible base substrate including a bendable region and an unbendable region, the bendable region including a bendable edge and an unbendable edge, the unbendable edge extending in a first direction; and at least one transistor in the bendable region of the flexible base substrate, including a gate electrode, a source region, a drain region, and an active layer, wherein the active layer extends in a direction substantially parallel to the first direction.

17 Claims, 9 Drawing Sheets

(51) Int. Cl.
*H01L 29/08* (2006.01)
*H01L 27/32* (2006.01)

100

200

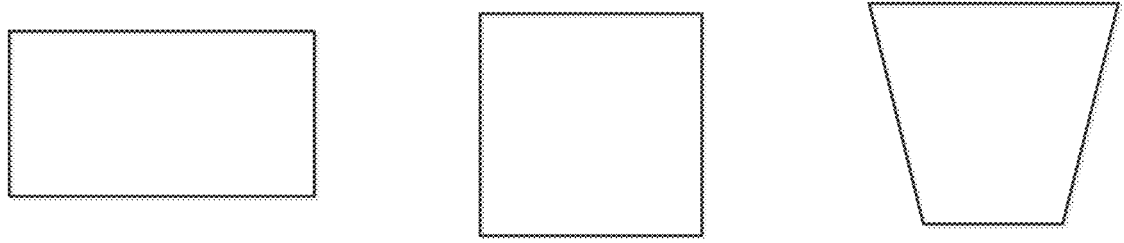

Fig. 7

Step S810: providing a flexible base substrate, the flexible base substrate comprising a bendable region and an unbendable region, the bendable region comprising a bendable edge and an unbendable edge, the unbendable edge extending in a first direction

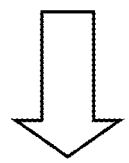

Step S820: forming at least one transistor in the bendable region of the flexible base substrate, the at least one transistor comprising a gate electrode, a source region, a drain region, and an active layer, the active layer extending in a direction substantially parallel to the first direction

Fig. 8

# FLEXIBLE DISPLAY SUBSTRATE, METHOD FOR MANUFACTURING THE SAME, FLEXIBLE DISPLAY PANEL, AND FLEXIBLE DISPLAY DEVICE

CROSS-REFERENCE TO RELATED APPLICATION

This application claims the priority benefit of Chinese Patent Application No. 201711246122.9 filed on Nov. 30, 2017 in the State Intellectual Property Office of China, the disclosure of which is incorporated herein by reference in entirety.

BACKGROUND

Technical Field

Embodiments of the present disclosure relate to the field of display technology, and in particular, to a flexible display substrate, a method for manufacturing the same, a flexible display panel, and a flexible display device.

Description of the Related Art

A flexible organic light-emitting diode (abbreviated as OLED) device has a characteristic of self luminescence, and a flexible OLED display device manufactured using it has a relatively large viewing angle and is bendable, thus the flexible OLED device may be used to manufacture various bendable devices with different shapes according to actual needs. Compared with a hard-screen display device, the flexible OLED display device has more significant advantages, and it is more and more widely used in the field of display technology.

In the OLED display device, a flexible display substrate or a flexible display panel plays an increasingly important role, and therefore higher requirements are raised in aspect of their own performance.

SUMMARY

An embodiment of the present disclosure provides a flexible display substrate, a method for manufacturing the same, a flexible display panel, and a flexible display device.

In an aspect of the present disclosure, there is provided a flexible display substrate, comprising: a flexible base substrate comprising a bendable region and an unbendable region, the bendable region comprising a bendable edge and an unbendable edge, the unbendable edge extending in a first direction; and at least one transistor in the bendable region of the flexible base substrate, comprising a gate electrode, a source region, a drain region, and an active layer, wherein the active layer extends in a direction substantially parallel to the first direction.

In an example, a gate insulation layer is provided between the active layer and the gate electrode, and at least one groove is provided at at least one side of the transistor in the gate insulation layer.

In an example, the at least one groove is filled with an organic material.

In an example, at least two grooves are provided respectively at both sides of a reference axis which is an axis passing through the transistor and extending in the first direction.

In an example, the at least one groove extends through the gate insulation layer.

In an example, the flexible display substrate further comprises a sub-interlayer insulation layer above the gate insulation layer, wherein the at least one groove extends through the sub-interlayer insulation layer and ends in the gate insulation layer.

In an example, the flexible display substrate further comprises at least one of a barrier layer and a buffer layer below the gate insulation layer, wherein the at least one groove extends through the gate insulation layer and ends in the buffer layer, or extends through the gate insulation layer and the buffer layer and ends in the barrier layer.

In an example, the at least one groove has a cross section in a form of rectangle, square, or trapezoid, perpendicular to the first direction.

In an example, an edge profile of the at least one groove in a cross section thereof perpendicular to the first direction is stepped.

In an example, the source region, the drain region and/or the gate electrode of the at least one transistor extends in the direction substantially parallel to the first direction.

In an example, the at least one transistor comprises at least one drive transistor, and an active layer of the at least one drive transistor is at least partially arranged in a generally elongated shape and extends in the direction substantially parallel to the first direction.

In an example, the at least one transistor further comprises at least one transmitting transistor, and an active layer of the at least one transmitting transistor is at least partially arranged in a generally elongated shape and extends in the direction substantially parallel to the first direction.

In another aspect of the present disclosure, there is provided a method for manufacturing the above-described flexible display substrate, comprising: providing a flexible base substrate, the flexible base substrate comprising a bendable region and an unbendable region, the bendable region comprising a bendable edge and an unbendable edge, the unbendable edge extending in a first direction; and forming at least one transistor in the bendable region of the flexible base substrate, the at least one transistor comprising a gate electrode, a source region, a drain region, and an active layer, wherein the active layer extends in a direction substantially parallel to the first direction.

In an example, the method further comprises: forming a gate insulation layer between the active layer and the gate electrode, and forming at least one groove at at least one side of the transistor in the gate insulation layer.

In an example, the method further comprises filling the at least one groove with an organic material.

In an example, forming the at least one groove comprises forming the at least one groove with a stepped edge profile by a photolithography process using a halftone or grayscale mask.

In a further aspect of the present disclosure, there is provided a flexible display panel, comprising the above-described flexible display substrate.

In a still further aspect of the present disclosure, there is provided a flexible display device, comprising the above-described flexible display panel.

BRIEF DESCRIPTION OF THE DRAWINGS

In order to more clearly explain technical solutions of embodiments of the present disclosure, the drawings for illustrating the embodiments will be briefly described below. It should be understood that the drawings described below are merely related to some embodiments of the present disclosure, but not limit the present disclosure. In the drawings:

FIG. 7 is a schematic view showing different shapes of the groove shown in FIG. 5;

FIG. 8 is a flowchart of a method for manufacturing the flexible display substrate shown in FIG. 3 according to an embodiment of the present disclosure;

DETAILED DESCRIPTION OF EMBODIMENTS

Figure 1:
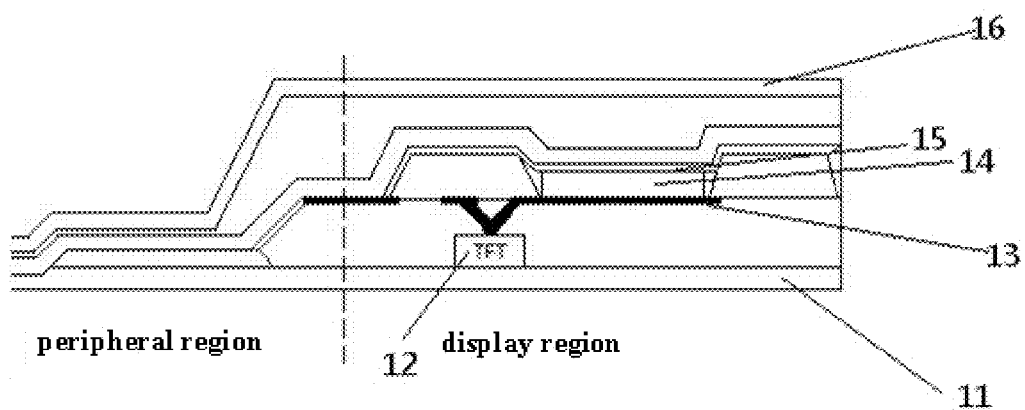
FIG. 1 is a schematic structural view of an AMOLED display panel.

In order to more clearly set forth the purpose, technical solutions and advantages of the present disclosure, the embodiments of the present disclosure will be described in detail below with reference to the accompanying drawings. It should be understood that the following description of the embodiments is intended to explain and illustrate the general inventive concept of the present disclosure and should not be construed as limiting the present disclosure. In the specification and the drawings, the same or similar reference numerals refer to the same or similar parts or components. For the sake of clarity, the drawings are not necessarily drawn to scale, and some well-known parts and structures may be omitted from the drawings.

Unless otherwise specified, technical terms or scientific terms used in the present disclosure have the same meanings as commonly understood by those skilled in the art to which the present disclosure belongs. The word "first", "second" or the like used in the present disclosure does not denote any order, quantity, or importance, but rather merely serves to distinguish between different components. The word "a" or "an" does not exclude the inclusion of a plurality of objects. The word "comprise", "include" or the like means that the element or item preceding the word encompasses the elements or items listed after the word and equivalents thereof, without excluding other elements or items. The word "connect" or "join" or the like is not limited to a physical or mechanical connection, but may include an electrical connection, direct or indirect. The word "up", "down", "left", "right", "top", "bottom" or the like are only used to indicate a relative positional relationship. If the absolute position of the described object is changed, the relative positional relationship may also be correspondingly changed. If an element such as a layer, film, region, or base substrate is referred to as being "on" or "under" another element, this element can be directly "on" or "under" the another element, or alternatively there may be intermediate elements between them.

FIG. 1 is a schematic structural view of an active matrix organic light emitting diode (AMOLED) display panel. Referring to FIG. 1, in this AMOLED display panel 10, a TFT (Thin Film Transistor) array 12 is disposed on a substrate 11 such as a glass substrate, for controlling light emission of each pixel unit therein. An anode 13, an organic layer 14, a cathode 15 of an organic light emitting diode and the like are provided above the TFT array 12. As shown in FIG. 1, the anode 13, the organic layer 14, the cathode 15, and the like are stacked on an array substrate across which the TFT array 12 are provided, and then the AMOLED display panel is formed by encapsulating them with an encapsulation layer 16 or a cover plate. Specifically, the organic layer 14 may include an electron transport layer, a light emitting layer, and a hole transport layer. It should be appreciated by those skilled in the art that, in the above-mentioned AMOLED display panel, relative positions of the anode and the cathode may be determined according to actual needs, that is, the anode may be disposed above the cathode, or the anode may be disposed below the cathode.

In the case where it is desired that the AMOLED display panel is bendable or a flexible AMOLED display panel may be prepared, a glass substrate in the AMOLED display panel is generally replaced with a polyimide (PI) substrate so that a certain degree of bending may be performed.

Figure 2:
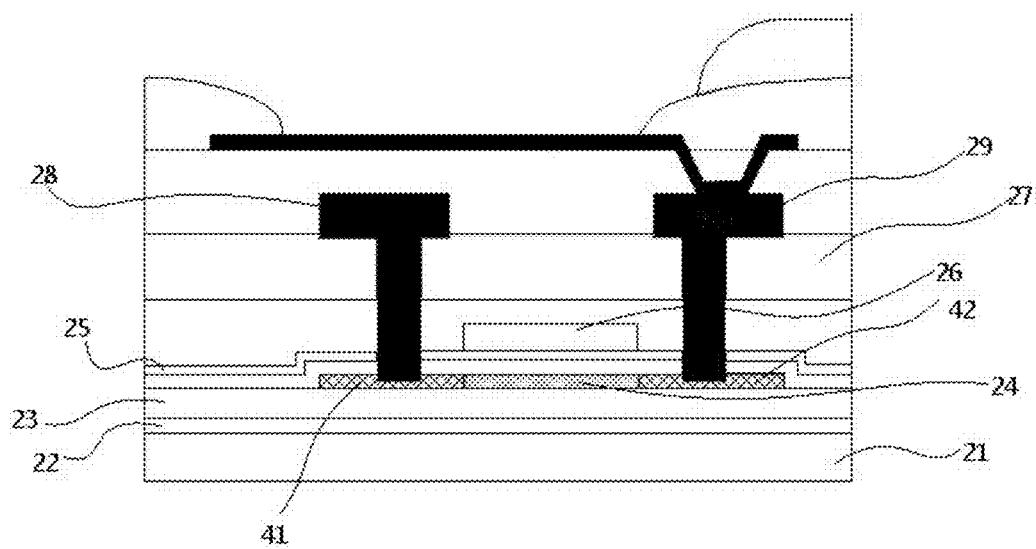
FIG. 2 is a schematic structural view of a backplane of a flexible AMOLED display panel according to an embodiment of the present disclosure.

FIG. 2 is a schematic structural view of a backplane of a flexible AMOLED display panel according to an embodiment of the present disclosure. As shown in FIG. 2, in the backplane 20 of the flexible AMOLED display panel, a barrier layer 22, a buffer layer 23, an active layer 24 (a source region 41 and a drain region 42 located in the same layer as the active layer 24), a gate insulation layer 25, a gate electrode 26, an inorganic layer 27, and a source electrode 28 and a drain electrode 29 located above the inorganic layer 27 are sequentially disposed on a flexible PI substrate 21. The drain electrode 29 is generally electrically connected to an anode of the organic light emitting diode.

However, as for the above flexible AMOLED display panel, although the PI substrate may allow the AMOLED display panel to bend to some extent, it is desired that a semiconductor device in the AMOLED display panel may have a better flexible design, in the case of a small radius bending or multiple times of bending.

For example, in an OLED display panel having a top gate type TFT, the structure of the top gate type TFT provides a certain degree of protection function for underlying active layer and gate insulation layer. However, during the bending, an inorganic material layer such as the gate insulation layer (the gate insulation layer 25 shown in FIG. 2) in a bendable region of the flexible display substrate or panel may be damaged, thereby device characteristics of the corresponding semiconductor device are shifted. As a result, a significant difference in brightness occurs between a bendable region and an unbendable region of the flexible display substrate or the flexible display panel.

This situation becomes more significant, particularly in the case of a small radius bending and/or multiple times of small radius bending. It can be understood that similar problems exist in a structure of a bottom gate type TFT.

In view of one or more of the above problems, embodiments of the present disclosure provide one or more technical solutions to at least partially solve the problem that the device characteristics of the semiconductor device (for example, TFT) in the bendable region of the above display substrate are shifted due to the bending thereof. Although the embodiments of the present disclosure are described with reference to the semiconductor device in a display region of the flexible display substrate, it is not excluded that a non-display region such as a peripheral line region of the flexible display substrate may also adopt a design similar to the present disclosure.

It should be understood that, the flexible display substrate described herein mainly refers to a substrate including a TFT array and related elements, and the flexible display panel mainly refers to a structure including a flexible display substrate and an organic light emitting diode disposed thereon. Correspondingly, the flexible display device refers to any display devices using the above-described flexible display substrate or flexible display panel. For ease of description, a flexible AMOLED display substrate is described here as an example.

Figure 3:
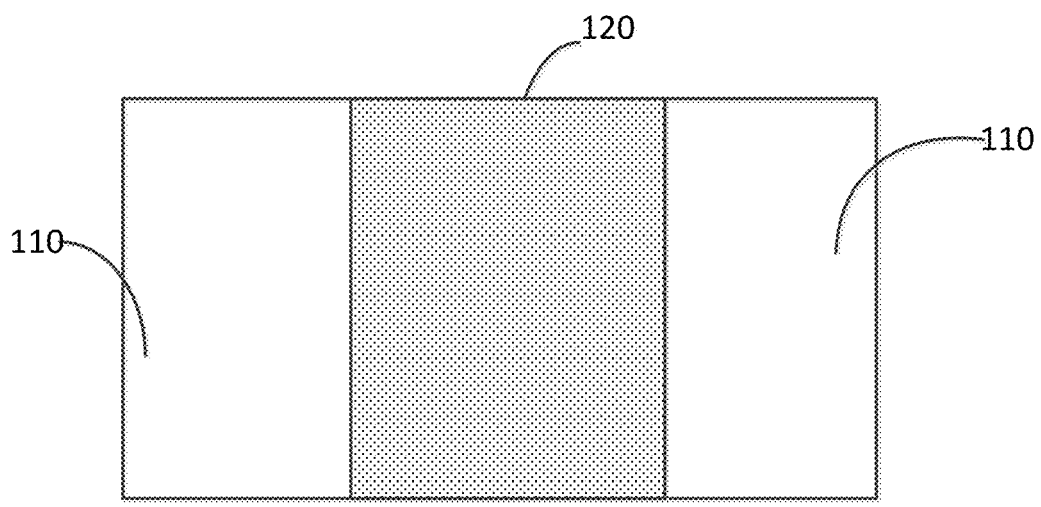
FIG. 3 is a schematic view showing arrangement positions of a bendable region and unbendable regions of a flexible display substrate according to an embodiment of the present disclosure.

FIG. 3 is a schematic view showing arrangement positions of a bendable region and unbendable regions of a flexible display substrate according to an embodiment of the present disclosure. As shown in FIG. 3, the flexible display substrate 100 includes a bendable region 120 and unbendable regions 110 located at both sides of the bendable region 120, the bendable region 120 and the unbendable regions 110 being disposed on the flexible base substrate in the display region. However, the semiconductor device (such as a thin film transistor (TFT)) in the bendable region 120 will be damaged to some extent after multiple times of bending or a small-radius bending, resulting in a shift of the device characteristics of the semiconductor device. It should be noted that, the embodiment of the present disclosure will be described by taking only the bendable region 120 disposed as required in the display region of the flexible display substrate 100 as an example, but it is not excluded that the bendable region 120 is disposed in the non-display region(s) of the flexible display substrate 100.

When the flexible display substrate 100 is bent by a plurality of times or in a small radius manner, an inorganic material layer (such as the gate insulation layer, an interlayer insulation layer (for example, the buffer layer, the barrier layer), etc.) in the semiconductor device is generally damaged or broken. The embodiments of the present disclosure propose to increase flexibility of all of or at least a part of the inorganic material layers in the flexible display substrate 100 so as to prevent the device characteristics of the semiconductor device from shifting to some extent, thereby avoiding a significant difference in an aspect of display characteristics such as brightness and the like between the bendable region 120 and the unbendable region 110 when the flexible display substrate 100 is used in the flexible display panel or the flexible display device.

Figure 4:
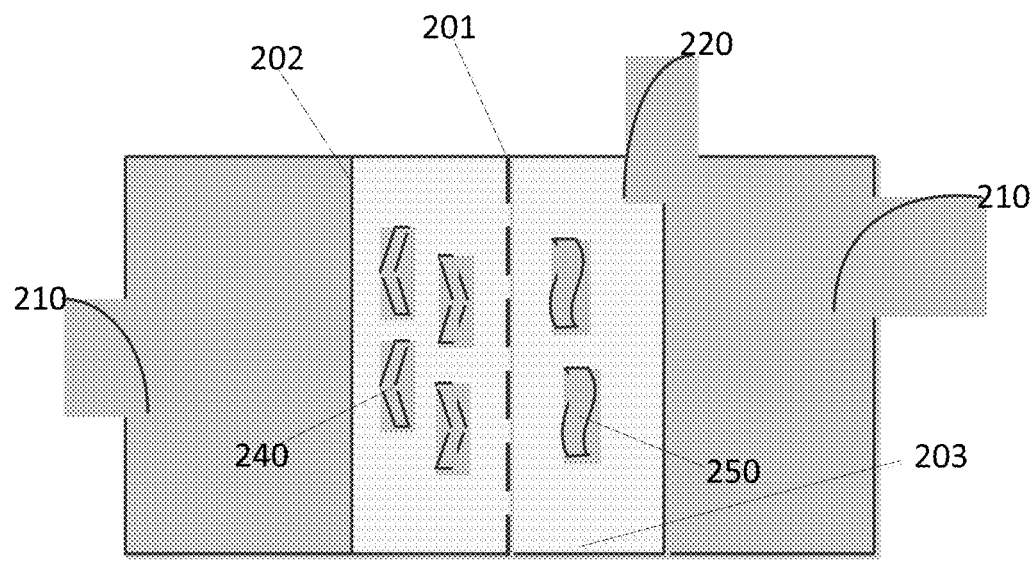
FIG. 4 is a schematic view showing an arrangement direction of transistors provided in the bendable region of a flexible display substrate according to an embodiment of the present disclosure.
Figure 5:
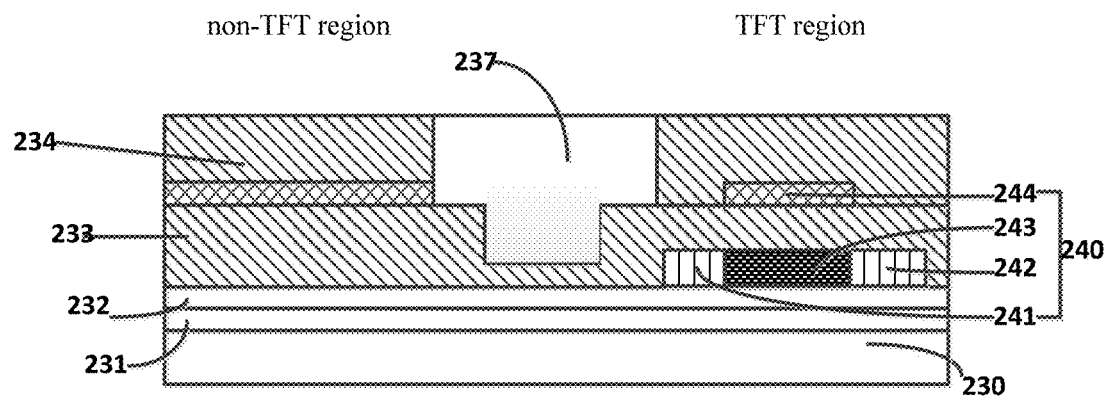
FIG. 5 shows a groove provided at a side of the transistor in the bendable region of the flexible display substrate shown in FIG. 4.
Figure 5A:
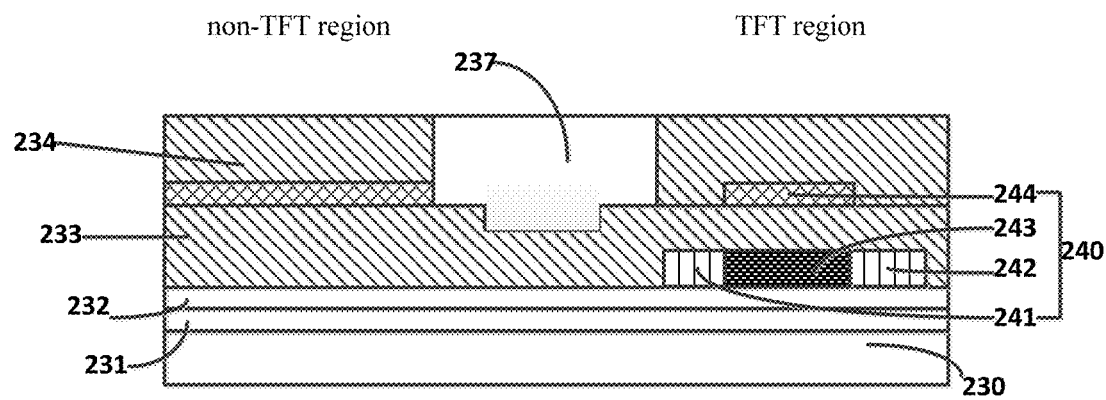
FIGS. 5A and 5B respectively show the groove in FIG. 5 extending into different layers.
Figure 5B:
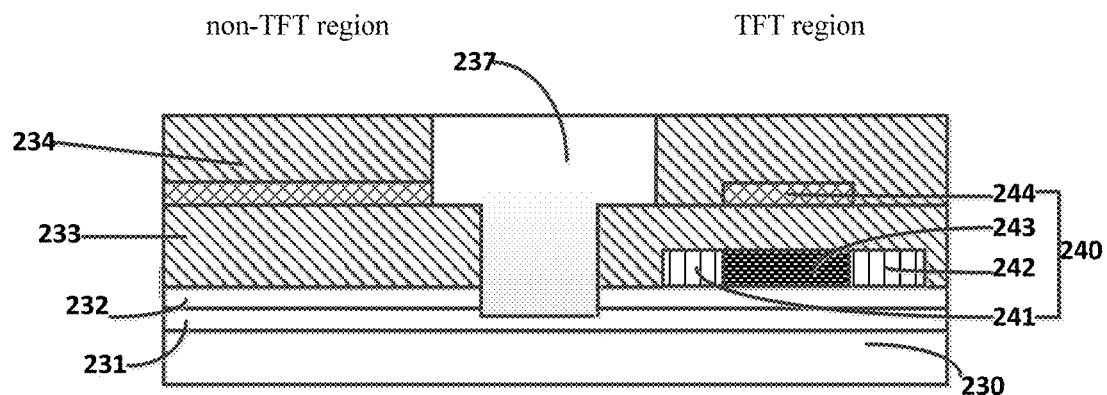
Figure 6:
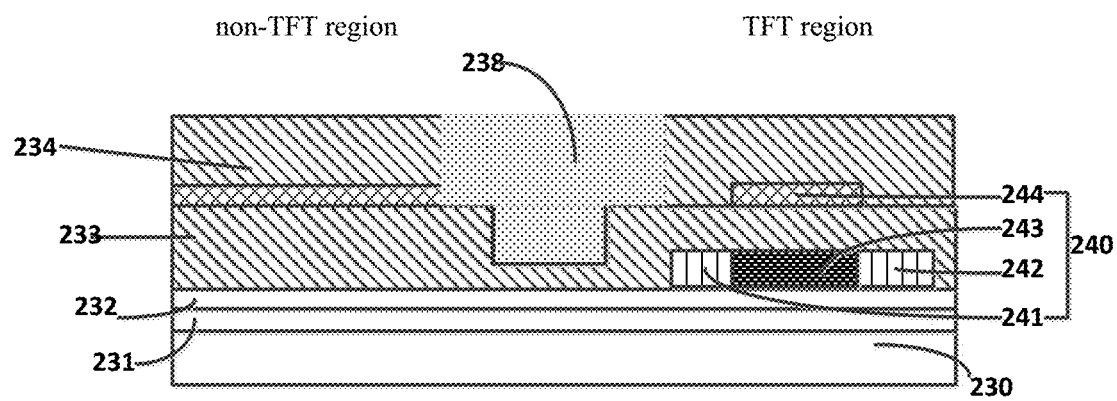
FIG. 6 is a schematic structural view showing that an organic material is filled in the groove of the flexible display substrate shown in FIG. 5.

FIG. 4 is a schematic view showing an arrangement direction of transistors provided in a bendable region of a flexible display substrate according to an embodiment of the present disclosure; FIG. 5 shows a groove provided at a side of the transistor in the bendable region of the flexible display substrate shown in FIG. 4; FIGS. 5A and 5B respectively show the grooves in FIG. 5 extending into different layers; and FIG. 6 is a schematic structural view showing that an organic material is filled in the groove of the flexible display substrate shown in FIG. 5. Herein, FIGS. 5, 5A, 5B, and 6 show cross sections perpendicular to a first direction in FIG. 4.

As shown in FIGS. 4 and 5, an embodiment of the present disclosure provides a flexible display substrate 200. The flexible display substrate 200 includes a flexible base substrate 230. A bendable region 220 and unbendable regions 210 are provided on the flexible base substrate 230 as required. In general, the unbendable regions 210 are located at both sides of the bendable region 220. If a small radius bending or multiple times of bending are made at the bendable region 220, the device characteristics of the semiconductor device in the bendable region 220 will shift. To this end, in an embodiment of the present disclosure, transistors are arranged in a bending direction to reduce stresses applied to the transistors, especially stresses applied to the inorganic material layer therein, during the bending. Herein, the bending direction refers to an extending direction of a crease formed by the bending.

It can be appreciated that, the flexible base substrate 230 may be provided with the above-mentioned bendable region 220 and unbendable regions 210 as required, but the arrangement is not limited to the illustrated cases. That is, a plurality of bendable regions 220 may be provided and their positions and sizes may be selected as required.

Specifically, as shown in FIG. 4, the bendable region 220 includes an unbendable edge 202 and a bendable edge 203. The unbendable edge 202 extends in the first direction 201, that is, during the bending, the unbendable edge 202 does not bend to any extent. Correspondingly, the bendable edge 203 extends substantially in a direction perpendicular to the first direction 201, the bendable edge 203 will bend during the bending. It is apparent that the bendable edge 203 may be set to be angled with regard to the first direction 201 at any angle as required, rather than being parallel to the first direction 201.

At least one transistor 240, 250, for example at least one drive transistor 240 and/or at least one transmitting transistor 250, may further be provided in the bendable region 220.

Each of the at least one transistors 240, 250 includes a gate electrode 244, a source region 241, a drain region 242, and an active layer 243. The active layer 243 extends in a direction substantially parallel to the first direction 201. It should be noted that the embodiments of the present disclosure are described by taking an oxide thin film transistor as an example, but those skilled in the art can also select other types of transistors as required.

In a left half portion of the bendable region 220 in FIG. 4, it illustrates respective shapes of the active layers of four drive transistors, while in a right half portion of the bendable region 220, it illustrates the shapes of the active layers of two transmitting transistors. Obviously, the positions of the transistors and their numbers and shapes can be arbitrarily set in the embodiments of the present disclosure without being limited to the case shown in FIG. 4, and FIG. 4 is only an exemplary example for explaining that it is desirable to arrange the transistors (especially their active layers) such as the drive transistors and/or the transmitting transistors in an arrangement direction substantially parallel to the first direction 201 (the arrangement direction generally corresponds to the bending direction or crease direction of the flexible display substrate).

In the arrangement that the active layer 243 of each transistor extends in the direction substantially parallel to the first direction 201, the source region, the drain region and gate electrode of each transistor are also generally arranged in the direction substantially parallel to the first direction 201. Alternatively, one or more of them may be arranged in the direction substantially parallel to the first direction 201, or otherwise arranged as required.

Further, referring to FIGS. 3 and 4, according to another embodiment of the present disclosure, in addition to the arrangement of the transistor (especially the active layer) in the bending direction in the bendable region 220, a groove may further be provided in a periphery of the transistor and the groove is filled with an organic material, so as to increase the flexibility of the transistor during bending the flexible AMOLED display panel. In this way, it may reduce the stresses applied to the transistor during the bending, reduce or even eliminate the shift of the device characteristics of the transistor. It is apparent for those skilled in the art to provide the groove(s) at one side or both sides of the transistor as required, and even to provide the grooves to surround the transistor partially or completely.

Specifically, the flexible base substrate 230 of the flexible display substrate 200 is divided into a TFT region and a non-TFT region. In the figure, it shows a non-TFT region at the left side of the TFT region, but it also has a non-TFT region at the right side of the TFT region. According to the embodiment of the present disclosure, the TFT region refers to a region in which a transistor is disposed, and correspondingly the non-TFT region refers to a region in which no transistor is disposed.

In the TFT region, a barrier layer 231, a buffer layer 232, an active layer 243, and a source region 241 and a drain region 242 both located in the same layer as the active layer 243, a gate insulation layer 233, a gate electrode 244 and an sub-interlayer insulation layer 234 may also be sequentially disposed on the flexible base substrate 230. A source electrode 245 and a drain electrode 246 are provided above and corresponding to the source region 241 and the drain region 242 via through holes 247. The drain electrode 246 is used to connect with an anode or a cathode of an organic light emitting diode, referring to FIG. 9F.

Regardless of whether it is a top gate type TFT structure or a bottom gate type TFT structure, the gate insulation layer 233 is further provided between the active layer 243 and the gate electrode 244. In the embodiments of the present disclosure, only the top gate type TFT structure is taken as an example for description, but it is readily thought of for those skilled in the art that a similar design may also be adopted in the bottom gate type TFT structure.

In one example, in order to further increase the flexibility of the peripheral structure of the transistor 240 in the TFT region, a groove 237 is formed in the gate insulation layer 233 at at least one side (the left side in FIG. 5) of the transistor 240, and the groove 237 is filled with an organic material 238.

Figure 10:
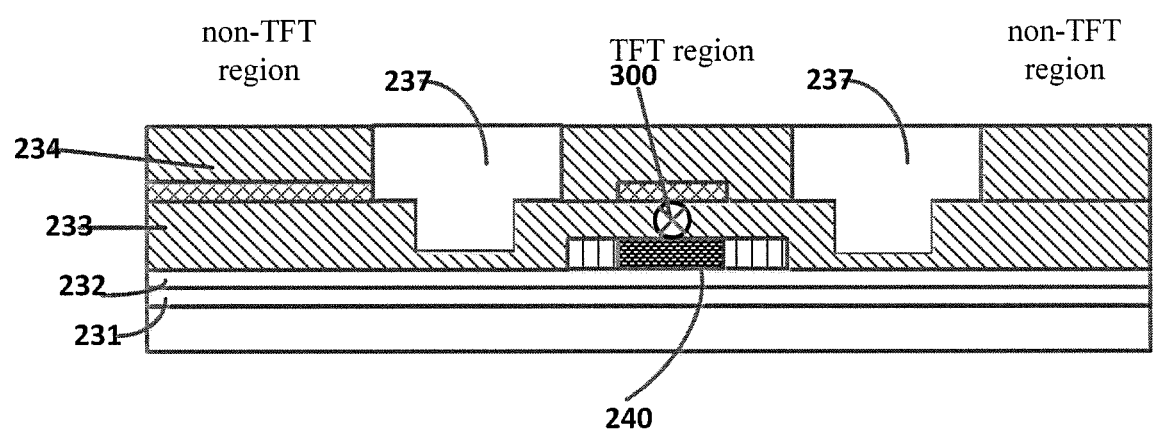
FIG. 10 shows two grooves provided at both sides of the transistor in the bendable region of the flexible display substrate shown in FIG. 4.

In one example, grooves 237 are disposed at both sides of the transistor 240 parallel to the first direction 201, referring to FIG. 10, two grooves 237 are provided respectively at both sides of a reference axis 300 which is an axis passing through the transistor 240 and extending in the first direction 201. Of course, it is also possible to provide the grooves 237 to partially or completely surround the transistor 240.

As shown in FIG. 5, the groove 237 is configured to extend through the sub-interlayer insulation layer 234 and extend into a portion of the gate insulation layer 233. As a contrast, FIGS. 5A and 5B respectively show the groove in FIG. 5 extends into different layers. In FIG. 5A, the groove 237 is configured to extend through the sub-interlayer insulation layer 234 and extend into the gate insulation layer 233, i.e., the groove 237 may extend through only a portion of the gate insulation layer 233. That is to say, the groove 237 extends in a region where the groove 237 is located from an upper surface of the sub-interlayer insulation layer to a position which does not exceed a lower surface of the gate insulation layer 233. It should be noted that the term "extend through" as used herein means that the groove completely penetrates through the said layer, and the term "extend into" means that the groove extends through a portion of the said layer but does not completely penetrate through the said layer.

Thus, when the sub-interlayer insulation layer 234 is provided on the flexible base substrate 230, the groove 237 may be configured to extend through the sub-interlayer insulation layer 234 and extend into the gate insulation layer 233, as shown in FIG. 5A.

In the example shown in FIG. 5, the interlayer insulation layer includes a barrier layer 231 and a buffer layer 232 in addition to the sub-interlayer insulation layer 234. Alternatively, the interlayer insulation layer may include at least one of the barrier layer 231 and the buffer layer 232. In this case, it is possible for those skilled in the art to configure the groove 237 to extend through the gate insulation layer 233 and extend into the buffer layer 232, or extend through the gate insulation layer 233 and the buffer layer 232 and extend into the barrier layer 231, as required.

In one example, as shown in FIG. 5B, the groove 237 may extend through the gate insulation layer and the buffer layer 232, and extend in 20-95% of the barrier layer 231.

FIG. 7 is a schematic view showing different shapes of the groove shown in FIG. 5. As shown in FIG. 7, the cross section of the groove 237 perpendicular to the first direction 201 is in a form of a rectangle, a square, or a trapezoid. Of course, the shape of the groove 237 may be otherwise set by those skilled in the art as required, but it is not limited to the specific examples described above.

Another shape of the groove 237 is shown in FIG. 5, in which an edge profile of the groove 237 in a cross section thereof perpendicular to the first direction 201 is stepped. In this case, since the edge profile of the groove 237 is stepped, it may alleviate the stress generated during the bending to a great extent. In the example of FIG. 5, it is illustrated that in a condition that the groove 237 extends through the sub-interlayer insulation layer 234 and extends in a portion of the gate insulation layer 233, then the step shape thus formed is configured in such a way that an upper part of the groove extending through the sub-interlayer insulation layer 234 has a larger opening width, and the remaining lower part of the groove has a smaller opening width. That is, the cross section of the groove in FIG. 5 forms a step, and the upper part of the groove has a larger opening width and the lower part of the groove has a smaller opening width. It can be appreciated that it is possible for those skilled in the art to configure the above step shape to have several steps, rather than being limited to the illustrated form. Alternatively, it is also possible to configure that the upper part of the groove has a smaller opening width and the lower part of the groove has a larger opening width.

In the embodiments of the present disclosure, it is not intended to limit the types of the transistors in the flexible display substrate 200. However, if the at least one transistor 240, 250 includes at least one drive transistor 240, then the active layer 243 of the at least one drive transistor 240 is at least partially arranged in a generally elongated shape and extends in the direction substantially parallel to the first direction 201. Further, if the at least one transistor 240, 250 of the flexible display substrate 200 further includes at least one transmitting transistor 250, then the active layer of the at least one transmitting transistor 250 is also at least partially arranged in a generally elongated shape and extends in the direction substantially parallel to the first direction 201.

FIG. 8 is a flowchart of a method for manufacturing the flexible display substrate shown in FIG. 3 according to an embodiment of the present disclosure. Referring to FIG. 8, the embodiment of the present disclosure provides a method for manufacturing the flexible display substrate 200 described above.

Step S810: providing a flexible base substrate 230, the flexible base substrate 230 comprising a bendable region 220 and an unbendable region 210, the bendable region 220 comprising a bendable edge 202 and an unbendable edge 203, the unbendable edge 203 extending in a first direction 201, and the bendable edge 203 extending in a direction substantially perpendicular to the first direction 201.

Step S820: forming at least one transistor 240, 250 in the bendable region 220 of the flexible base substrate 230, the at least one transistor 240, 250 comprising a gate electrode 244, a source region 241, a drain region 242, and an active layer 243, and the active layer 243 extending in the direction substantially parallel to the first direction 201.

FIGS. 9A, 9B, 9C, 9D, 9E, and 9F are schematic structural views of the flexible display substrate shown in FIG. 3 in different steps of a manufacturing flow of the flexible display substrate according to an embodiment of the present disclosure. FIGS. 9G and 9H are schematic structural views of the flexible display substrate shown in FIG. 6 in different steps of a manufacturing flow of the flexible display substrate according to an embodiment of the present disclosure. In one example, specifically, the method for manufacturing the above-described flexible display substrate 220 includes the following specific processes.

Figure 9A:
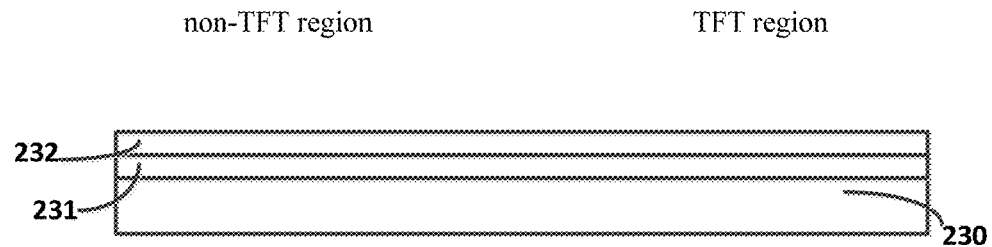
FIGS. 9A, 9B, 9C, 9D, 9E, and 9F are schematic structural views of the flexible display substrate shown in FIG. 3 in different steps of a manufacturing flow of the flexible display substrate according to an embodiment of the present disclosure.

As shown in FIG. 9A, a barrier layer 231 and a buffer layer 232 are sequentially formed on the flexible base substrate 230 in a TFT region of the flexible display substrate 200. In one example, the flexible base substrate 230 may be a PI substrate, the barrier layer 231 and the buffer layer 232 may be selected as required, and it is not always necessary to provide the barrier layer 231 and the buffer layer 232 at the same time, specifically, any one of them may be only provided.

Figure 9B:
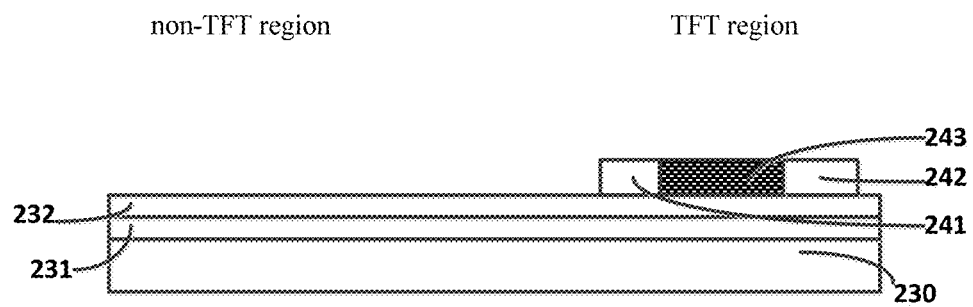

As shown in FIG. 9B, on the basis of the structure obtained in FIG. 9A, an active island specifically is prepared by a photolithography process, the active island specifically including a source region 241, an active layer 243, and a drain region 242. In order to reduce the process flows and optimize the processes, the source region 241 and the drain region 242 will be formed by doping the regions corresponding to the source region 241 and the drain region 242 in a subsequent preparation process for gate electrode. On the basis of the structure of FIG. 9A, an amorphous silicon film is deposited by PECVD, and a polysilicon film is formed by a crystallization technique, such as an excimer laser annealing method, a solid phase crystallization method, and a metal induced lateral crystallization method. The amorphous silicon film is formed by doping in a growth of the amorphous silicon film or doping with ions, for example, boron (B). After the crystallization, a pattern of the active island is formed by photolithography.

It should be noted that the cross-sectional view shown in FIG. 9B is a cross-sectional view taken along a cross section perpendicular to the first direction 201 in FIG. 4. The active layer 243 of the transistor 240 extends in a direction substantially parallel to the first direction 201. As described above, in the embodiment of the present disclosure, it is desirable that the active layer 243 of the transistor 240 is directly arranged in such a way that it extends in the direction parallel to the first direction 201 as much as possible during the process of manufacturing the transistor. Extending in the direction parallel to the first direction 201 herein means that it extends in a direction substantially parallel to the first direction 201, rather than parallel to the first direction 201 in a strict sense. In one example, the transistor 240 and particularly the active layer 243 therein may be arranged in a generally elongated shape to further increase the ability of the transistor to withstand the stresses generated during the bending.

Figure 9C:
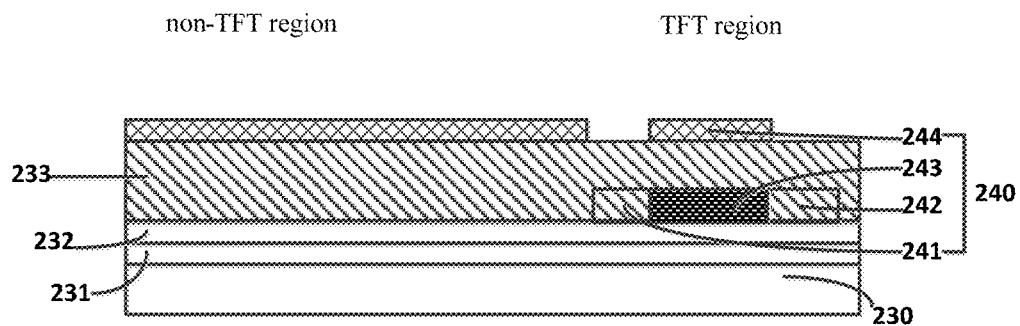

As shown in FIG. 9C, on the basis of the structure obtained in FIG. 9B, a gate electrode 244 is formed by a photolithography process. Specifically, a gate insulation layer 233 is deposited by a PECVD method, a layer of metal is then sputtered to act as a gate electrode, and the gate electrode 244 is formed by the photolithography process.

Figure 9D:
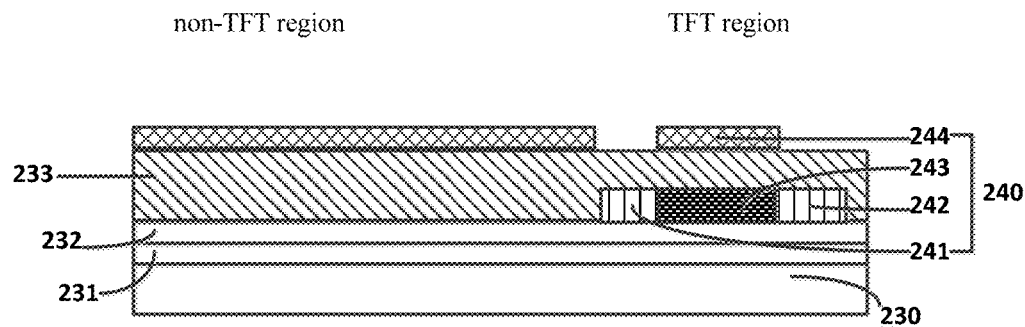

As shown in FIG. 9D, a pattern of the gate electrode 244 is employed to block the doping in the top gate structure of this example. Phosphorus doping may be performed by using the gate electrode as a mask to form the source region 241 and the drain region 242 of the transistor.

Figure 9E:
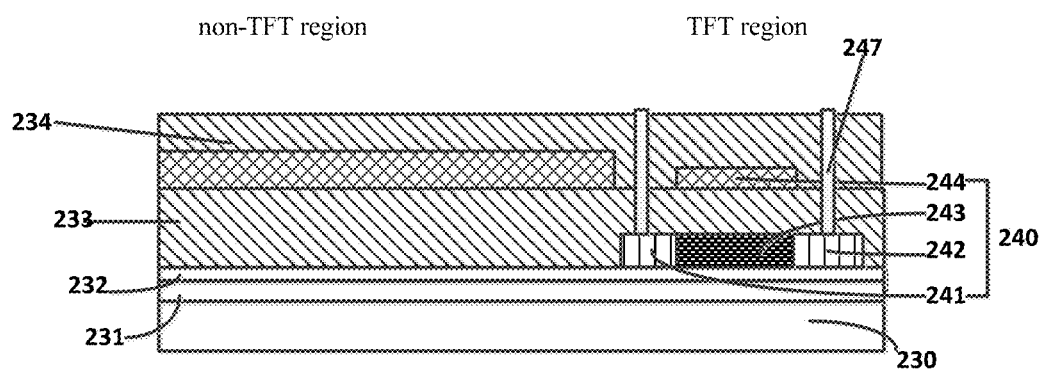

As shown in FIG. 9E, on the basis of the structure shown in FIG. 9D, after the sub-interlayer insulation layer 234 is deposited by PECVD, via holes 247 are formed by a photolithography process.

Figure 9F:
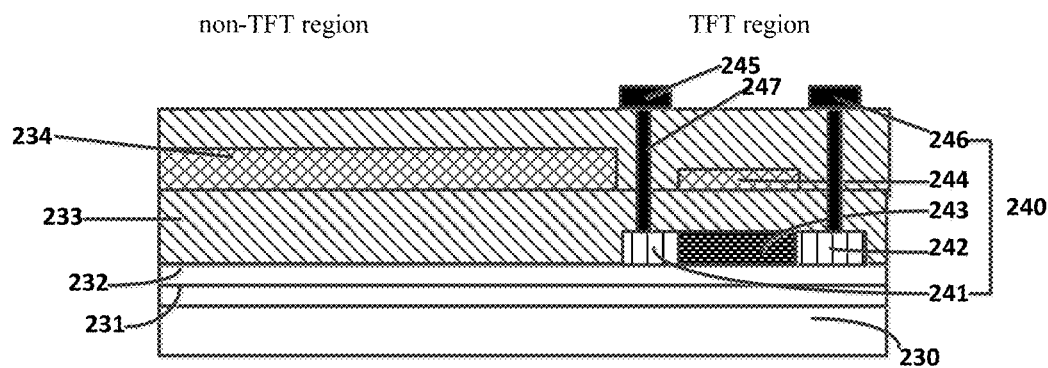
Figure 9G:
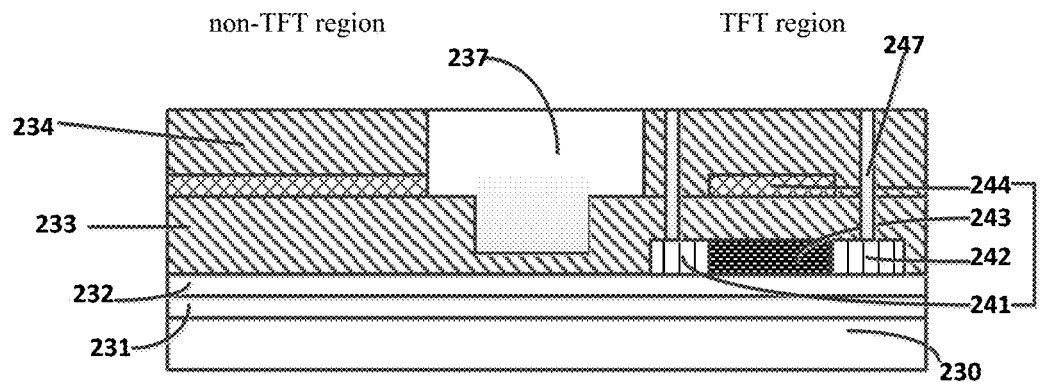
FIGS. 9G and 9H are schematic structural views of the flexible display substrate shown in FIG. 6 in different steps of a manufacturing flow of the flexible display substrate according to an embodiment of the present disclosure.
Figure 9H:
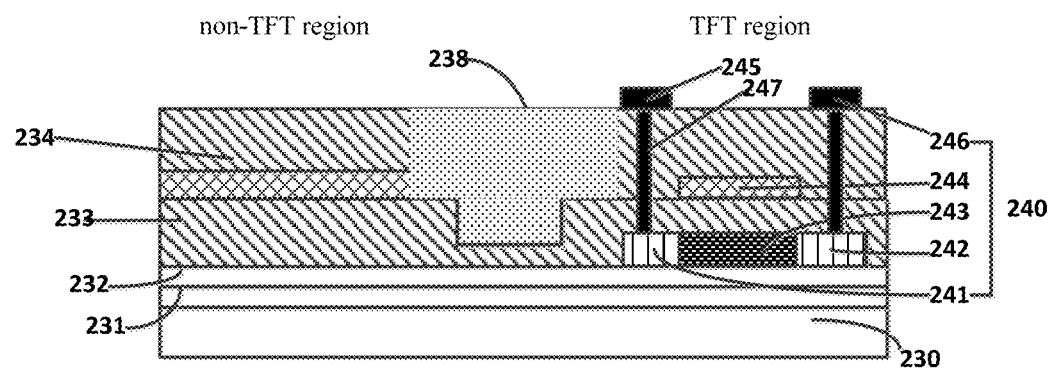

As shown in FIG. 9F, on the basis of the structure shown in FIG. 9E, a source/drain metal layer is formed by sputtering, and a source electrode 245 and a drain electrode 246 are formed by a photolithography process. At the via holes 247, the source 245 and the drain 246 are electrically connected to the source region 241 and the drain region 242 of the transistor, respectively.

In another embodiment of the present disclosure, in the case where a groove is provided at one side of the transistor 240, as shown in FIG. 9G, after the sub-interlayer insulation layer 234 is formed on the basis of the structure shown in FIG. 9D, the groove 237 and the via holes 247 are formed by etching in a predetermined groove arrangement region and positions of the via holes corresponding to the source electrode and the drain electrode through a halftone or grayscale mask, respectively.

In the illustrated case, an etching depth of the groove 237 may be a sum of the thickness of the sub-interlayer insulation layer 234 and a portion of the thickness of the gate insulation layer 233. The residual film thickness in a Halftone buffer portion is 120% to 200% of the thickness of the etched region. It can be understood that the etching depth of the groove 237 may be set as required. For example, the groove 237 may extend through the entire gate insulation layer, or may only extend through a part of the gate insulation layer. Alternatively, the etching depth of the groove 237 may be a sum of the thickness of the gate insulation layer 233 and a portion of the thickness of the buffer layer 232, or a sum of the thickness of the gate insulation layer 233 and the total thickness of the buffer layer 232. Accordingly, it should be appreciated by those skilled in the art that the groove 237 extending through the gate insulation layer may be formed by the above process after the pattern of the gate electrode is formed. Other methods for generating the depth of the groove will not be further described in the present disclosure, and it is possible for those skilled in the art to choose suitable layers to perform the similar etching process according to actual needs.

When the groove 237 is being etched, a photolithography process using a halftone or grayscale mask may be used to form the groove 237 having a stepped edge profile. In this way, after filling the groove 237 with the organic material 238, stress extension may be suppressed, and the damage to the inorganic material layer such as the gate insulation layer and the like during the bending may be reduced. In order to increase buffer regions, a photolithography process using a halftone or grayscale mask is applied at the edge regions of the transistors 240, 250, thereby buffer regions of 0.5 µm to 1 µm are formed at the edges of the transistors 240, 250. Furthermore, at the buffer regions, the residual film thickness is 120% to 200% of the thickness of the etched region.

As shown in FIG. 9H, on the basis of the structure shown in FIG. 9G, after the groove 237 is formed by etching, a coating process of the organic material 238 is performed to fill the groove 237 with the organic material 238. The organic material 238 may be polyimide or acrylic.

In addition, the source electrode 245 and the drain electrode 246 may be formed by sputtering a source/drain metal layer and a photolithography process on the basis of the structure shown in FIG. 9H.

In addition, if an AMOLED display panel is to be formed, the preparation of the subsequent film layer of the organic light emitting diode may be completed on the basis of the structure shown in FIG. 9G or FIG. 9H. Since the main improvement of the embodiments of the present disclosure lies in the flexible display substrate, that preparation processes will not be described in detail.

A further embodiment of the present disclosure provides a flexible display panel including at least one above-described flexible display substrate. In addition, the flexible display substrate further includes an organic light emitting diode fitted and connected with the above-described flexible display substrate to form the AMOLED display panel.

An embodiment of the present disclosure also provides a flexible display device including the above-described flexible display panel. The flexible display device is a flexible oxide OLED or a flexible Low Temperature Poly-Silicon (LTPS) OLED. The flexible display device according to the embodiments of the present disclosure may include any products having a display function, such as a mobile phone, a television set, a computer monitor, a tablet computer, a laptop computer, a digital photo frame, a personal digital assistant, a navigator, and the like. The present disclosure is not intended to limit the form of the flexible display device.

The embodiments of the present disclosure provide a flexible display substrate, a method for manufacturing the same, a flexible display panel, and a flexible display device. By arranging the active layer of the transistor in a direction substantially parallel to the first direction in the bendable region of the flexible display substrate, the flexibility can be increased to prevent the device characteristics of the transistor from shifting. As a result, it avoids a significant difference between the bendable region and the unbendable region (for example, the peripheral region) in the flexible display panel or the flexible display device in brightness.

The above embodiments are merely intended to exemplarily illustrate the principles and configurations of the present disclosure, but not intended to limit the present disclosure. It should be understood by those skilled in the art that any changes or improvements made to the present disclosure without departing from the general concept of the present disclosure will fall within the scope of the present disclosure. And improvements are within the scope of this disclosure. The scope of the present disclosure is defined by the claims of the present disclosure and equivalents thereof.

What is claimed is:

1. A flexible display substrate, comprising:
   a flexible base substrate comprising a bendable region and an unbendable region, the bendable region comprising a bendable edge and an unbendable edge, the unbendable edge extending in a first direction; and
   at least one transistor in the bendable region of the flexible base substrate, comprising a gate electrode, a source region, a drain region, and an active layer,
   wherein the active layer extends in a direction substantially parallel to the first direction,
   wherein the at least one transistor comprises at least one drive transistor, and an active layer of the at least one drive transistor is at least partially arranged in a generally elongated shape and extends in the direction substantially parallel to the first direction.

2. The flexible display substrate according to claim 1, wherein a gate insulation layer is provided between the active layer and the gate electrode, and at least one groove is provided on at least one side of the transistor in the gate insulation layer.

3. The flexible display substrate according to claim 2, wherein the at least one groove is filled with an organic material.

4. The flexible display substrate according to claim 2, wherein at least two grooves are provided respectively at both sides of a reference axis which is an axis passing through the transistor and extending in the first direction.

5. The flexible display substrate according to claim 2, wherein the at least one groove extends through the gate insulation layer.

6. The flexible display substrate according to claim 2, further comprising a sub-interlayer insulation layer above the gate insulation layer, wherein the at least one groove extends through the sub-interlayer insulation layer and ends in the gate insulation layer.

7. The flexible display substrate according to claim 2, further comprising at least one of a barrier layer and a buffer layer below the gate insulation layer, wherein the at least one groove extends through the gate insulation layer and ends in the buffer layer, or extends through the gate insulation layer and the buffer layer and ends in the barrier layer.

8. The flexible display substrate according to claim 2, wherein the at least one groove has a cross section in a form of rectangle, square, or trapezoid, perpendicular to the first direction.

9. The flexible display substrate according to claim 2, wherein an edge profile of the at least one groove in a cross section thereof perpendicular to the first direction is stepped.

10. The flexible display substrate according to claim 1, wherein the source region, the drain region and/or the gate electrode of the at least one transistor extends in the direction substantially parallel to the first direction.

11. The flexible display substrate according to claim 1, wherein the at least one transistor further comprises at least one transmitting transistor, and an active layer of the at least one transmitting transistor is at least partially arranged in a generally elongated shape and extends in the direction substantially parallel to the first direction.

12. The flexible display substrate of claim 1, comprising at least part of a flexible display panel.

13. The flexible display substrate of claim 1, comprising at least part of a flexible display device.

14. A method for manufacturing the flexible display substrate according to claim 1, comprising:
providing a flexible base substrate, the flexible base substrate comprising a bendable region and an unbendable region, the bendable region comprising a bendable edge and an unbendable edge, the unbendable edge extending in a first direction; and
forming at least one transistor in the bendable region of the flexible base substrate, the at least one transistor comprising a gate electrode, a source region, a drain region, and an active layer,
wherein the active layer extends in a direction substantially parallel to the first direction,
wherein the at least one transistor comprises at least one drive transistor, and an active layer of the at least one drive transistor is at least partially arranged in a generally elongated shape and extends in the direction substantially parallel to the first direction.

15. The method according to claim 14, further comprising:
forming a gate insulation layer between the active layer and the gate electrode, and forming at least one groove on at least one side of the transistor in the gate insulation layer.

16. The method according to claim 15, further comprising filling the at least one groove with an organic material.

17. The method according to claim 15, wherein forming the at least one groove comprises forming the at least one groove with a stepped edge profile by a photolithography process using a halftone or grayscale mask.

* * * * *